United States Patent [19]
Adams et al.

[11] Patent Number: 5,535,164
[45] Date of Patent: Jul. 9, 1996

[54] BIST TESTER FOR MULTIPLE MEMORIES

[75] Inventors: Robert D. Adams, Essex Junction; John Connor, Burlington; Garrett S. Koch, Cambridge, all of Vt.; Stuart D. Rapoport, New York, N.Y.; Luigi Ternullo, Jr., Colchester, Vt.

[73] Assignee: International Business Machines Corporation, Armonk, N.Y.

[21] Appl. No.: 398,468

[22] Filed: Mar. 3, 1995

[51] Int. Cl.$^6$ ................................................ G11C 7/00
[52] U.S. Cl. ........................................ 365/201; 371/21.1
[58] Field of Search ............................ 365/201, 230.05, 365/49; 371/21.1, 21.2

[56] References Cited

U.S. PATENT DOCUMENTS

| | | | |
|---|---|---|---|
| 5,051,997 | 9/1991 | Sakashita et al. | 371/22.4 |
| 5,138,619 | 8/1992 | Fasang et al. | 371/21.1 |
| 5,173,906 | 12/1992 | Dreibelbis et al. | 371/22.5 |
| 5,301,156 | 4/1994 | Talley | 365/201 |
| 5,329,471 | 7/1994 | Swoboda et al. | 364/578 |
| 5,349,587 | 9/1994 | Nadeau-Dostie et al. | 371/22.3 |
| 5,351,213 | 9/1994 | Nakashima | 365/201 |
| 5,388,104 | 2/1995 | Shirotori et al. | 371/21.1 |

*Primary Examiner*—A. Zarabian
*Attorney, Agent, or Firm*—Calfee, Halter & Griswold

[57] ABSTRACT

The present invention, provides a single BIST which can test various memories of different sizes, types and characteristics by using a state machine to select and generate all patterns required for testing all of the memories on the chip, and impressing all of the data, including expected data, and address information on all of the memories simultaneously. The BIST also generates unique (separate) control signals for the various memories and impresses these control signals on the various memories. The BIST selectively asserts the various control signals so as to apply (write) the data and to read and capture (load result) failure information only to/from those memories whose unique controls are asserted. Selective assertion of a memory's write enable signal prevents multiple writes to a location which can potentially mask cell write and leakage defects while selective assertion of a memory's load result signal is performed only when valid memory output data is expected so as not to capture false error information. The control signals instruct those memories that do not use a particular sequence of inputs or any portion of a given sequence of inputs to "ignore" such signals, thereby generating the necessary signals to form the test patterns for each and every memory, the data and address information for those patterns, the control signals to write and read each memory, and capture error information for that particular memory. Hence, a single BIST can be used to test a multiplicity of memories of different sizes and different types.

18 Claims, 7 Drawing Sheets

BIST TESTER FOR MULTIPLE MEMORIES

RELATED APPLICATION

U.S. patent application Ser. No. 08/398,465, filed Mar. 3, 1995, entitled "Using One Memory to Supply Addresses to an Associated Memory During Testing" (Atty. Docket No. BU9-95-001).

FIELD OF THE INVENTION

This invention relates generally to integrated circuit (or semiconductor) built-in self-test and, more particularly, to using a single built-in self-test state machine to test a plurality of embedded memories of various sizes and functions.

BACKGROUND ART

As integrated circuit art has advanced, more and more circuit devices, and consequently more circuits and circuit functions, have been placed on single chips. These circuits perform many different functions, and the circuits must be tested before they are put into use. Many circuits can be tested using external testers, i.e., testers which are not a part of or formed on the chip, but rather are separate stand-alone machines. Such circuits as memories in SIMMs or other add-on card or modules may be so tested. However, there are certain circuits that are not amenable to testing by such external machines for various reasons. For example, various memories associated with microprocessors do not have any external access pads or other means to connect to external machines for testing. A solution to this problem is to form test circuits directly on the same chip as the chip devices and other circuit components are formed. These embedded circuits are often referred to as a built-in self-test (BIST). A typical BIST is shown and described in U.S. Pat. No. 5,173,906 issued Dec. 22, 1992, and entitled "BUILT-IN SELF TEST FOR INTEGRATED CIRCUITS," which patent is hereby incorporated herein by reference. This BIST works very well and provides the necessary test functions to memories that are utilized in conjunction with or as a part of a microprocessor. However, with this on-chip tester, as with other BISTs, a separate BIST is required for each memory being tested or at least with each different type or size memory. While this can be done, each BIST requires a certain amount of space, or area on the surface of the chip, which space can be as much as 2-3% of the area of the chip with which it is associated and which it tests. A single BIST would be desirable to test all of the memories, and thus save valuable area on the chip surface. However, there are two major constraints to such a solution. First, no significant extra time should be needed for the testing, and such a BIST must be capable of performing all of the test functions and patterns required for each of the various memories irrespective of their sizes, types or characteristics.

SUMMARY OF THE INVENTION

According to the present invention, a single BIST is provided which can test various memories of different sizes and types and characteristics. This is accomplished by using a state machine, including logic, to select and generate all of the patterns required for testing all of the memories on the chip, and impressing all of the data, including expected data, and address information on all of the memories simultaneously. The BIST also generates unique (separate) control signals for the various memories and impresses these control signals on the various memories. The BIST selectively asserts the various control signals so as to apply (write) the data and to read and capture (load result) failure information only to/from those memories whose unique controls are asserted. The control signals instruct those memories that do not use a particular sequence of inputs or any portion of a given sequence of inputs to "ignore" such signals. Thus, the BIST generates the necessary signals to form the necessary test patterns for each and every memory, the data and address information for those patterns, and the control signals to write and read each memory, and capture error information for that particular memory. Hence, a single BIST can be used to test a multiplicity of memories of different sizes and different types. Selective assertion of a memory's write enable signal prevents multiple writes to a location which can potentially mask cell write defects and cell leakage defects. Selective assertion of a memory's load result signal prevents capture of a false fail signal due to potentially inverted data stored in the memory in the second and subsequent address accesses.

DESCRIPTION OF THE PREFERRED EMBODIMENT(S)

Before referring to the drawings specifically, an overview of the BIST and its operation should prove helpful. As described in U.S. Pat. No. 5,173,906, an on-chip built-in self-test (BIST) arrangement for VLSI circuits is provided. The BIST, which is embedded on the same chip as the VLSI, includes a data pattern generator for generating pre-determined test pattern data and writing the data to the inputs of VLSI circuits and for reading the results and comparing the results of the write to the expected results. Although the U.S. Pat. No. 5,173,906 discloses a BIST circuit for only a single memory, the operation is the same as that of the present invention, except that the present invention provides the necessary control logic circuits to utilize a single BIST for testing a multiplicity of different memories having different characteristics with the same test patterns being run concomitantly for the different memories.

A variety of different patterns can be generated depending upon the test desired. Certain memories will typically be tested with six different patterns, i.e., unique address ripple word (UARW), unique address ripple bit (UARB), checkerboard (CHBD), wordline stripe (WLS), blanket (BL) and programmable (PG) patterns. All of these patterns, except for the programmable pattern, are essentially "hard-coded", while the programmable pattern may be programmed as read-write data sequences and address limits during scanning and initialization of the logic as is well known in the art, and described in the U.S. Pat. No. 5,173,906.

A control signal generator is also provided for generating control signals for operation of the VLSI circuit to enable its operation on the test data.

A data generator, which may be, for some applications, the same test pattern generator, generates input and expected data ("expect data") from the application of the test data to the VLSI circuit. The "expect data" is compared against the actual data read from the memory and a pass/fail signal is generated in response thereto and is captured in a final compression latch. In this way, pre-determined test patterns may be applied to a VLSI circuit or a memory circuit by an embedded BIST on a microprocessor.

When redundancy is available, the location of a memory element failure is stored in the register which can be used for diagnostics and/or utilizing redundant memory, so as to repair a chip even if there is failure of one or more of the memory cells.

The BIST, as indicated above, is essentially a state machine, or more properly a series of dependent state machines, which move from one state (pattern, subcycle, mode) to another generating the different test patterns and necessary write enable and load result signals to test the various memories.

BIST 10 shuts off each memory's WE and LR signals as the current address exceeds that memory's address space and whenever else appropriate according to the individual memory's function. Shutting off the WE prevents rewriting memory locations through a particular pattern. Rewriting a memory can potentially mask charge leakage problems in the cells. When the maximum address is reached, the state machine enters a WAIT state, resets the address counter, and performs various updates, including the assertion of a new subcycle. For example, subcycle RC1 would perform a read 0, write 1, read 1, write 1 (ROW1R1W1). Immediately following the new subcycle, the state machine again begins to sequence through the address space applying the new subcycle's read/write data operations to the memories under test. The "0" written in the previous WC subcycle is read during the cell's first access (R0) of the RC1 subcycle in the UARW or UARB pattern. In the fourth access of the RC1 subcycle, the cell is written with opposite data (W1). When an address for smaller memories is accessed, the second and subsequent times and an R0 operation occurs, a "1" will be read out and a fail will be observed because BIST is expected to read a "0" during the access. To solve this, a common expect data bus and unique memory LR signals were used; whenever the present address is outside the memory's address space and the LR signal is shut off, a false fail signal generation can be prevented by ANDing LR with the compression output. If a memory unit has write-through capability, its LR signal needs to be asserted during write cycles within its address space so that its write-through capability can be verified by BIST 10.

Thus, the concept and circuitry of the U.S. Pat. No. 5,173,906 provides the basis for the state machine to generate the necessary test patterns, together with global write enable and global load result control signals which are used according to the present invention. However, the BIST in the U.S. Pat. No. 5,173,906 as specifically disclosed requires a single BIST for each memory or at least each memory configuration. In fact, this is alluded to in the U.S. Pat. No. 5,173,906 in that this patent indicates that various VLSI circuits on the chip may have different BISTs which require different times to complete the test patterns. Hence, each memory which is to be tested, or at least each of differing characteristics, requires a separate state machine, each running on its own signals and each requiring separate space on the chip for all of the functions, such as pattern control, pattern generation, etc. The present invention allows a single state machine of the type disclosed in the U.S. Pat. No. 5,173,906 to test separate memories having different characteristics at the same time.

Figure 1:
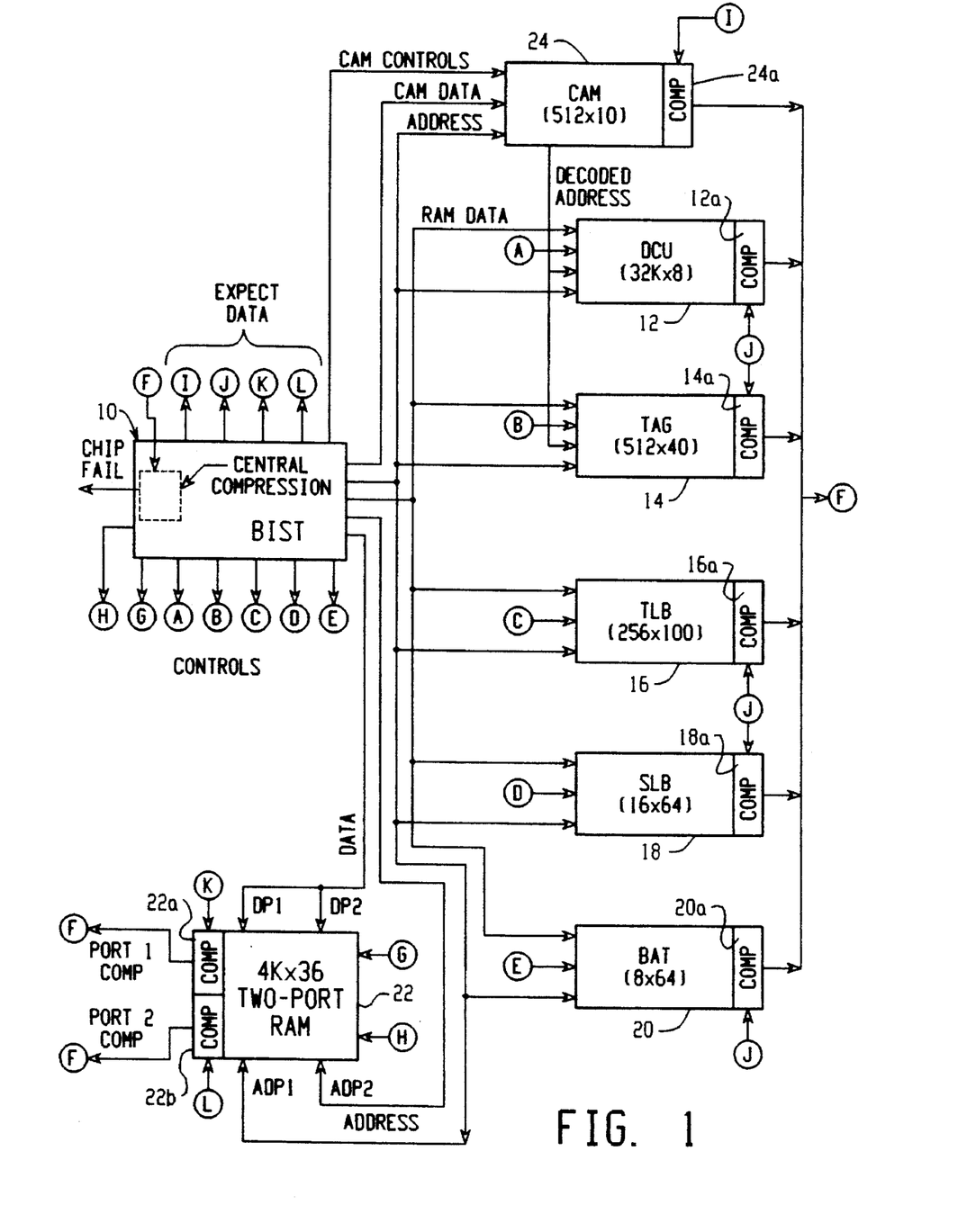
FIG. 1 is a high level block diagram of a BIST for simultaneously testing a plurality of memories (having different characteristics) embedded on a chip.

Referring now to the drawings, and for the present to FIG. 1, a high-level diagram of a group of memories and the associated BIST with circuit connections indicated is shown. It is to be understood that the built-in self-test (BIST) and the various memories are all formed on and as a part of an integrated circuit chip, having VLSI circuit components including various memories formed thereon, and that the BIST device remains on the chip after its test function has been performed or completed, but it performs no function during the normal operation of the chip in its operating or functioning mode, although it may be used during a power-on self-test (POST) when a system is initially turned on or during system diagnostics. In any event, it is desired to have a relatively small amount of area or "real estate" on the chip occupied by the BIST.

As shown in FIG. 1, a BIST 10 formed according to this invention is provided and formed on a silicon or other semiconductor substrate (not shown). The BIST 10 is connected to various different memories of different sizes and configurations. These particular memories are shown for illustrative purposes, and other types of memories with other characteristics can be employed and tested by the BIST 10 of the present invention. The memories include a data cache unit (DCU) memory 12, a TAG memory 14 (a type of memory that stores tags to look up other data), a translation lookaside buffer (TLB) memory 16, a segment lookaside buffer (SLB) memory 18, and a block address translation buffer (BAT) memory 20. All of these memories 12, 14, 16, 18 and 20 are single-port memories having different address depth, width and functional characteristics. The DCU memory 12 has a configuration of 32K×8, the TAG memory 14 has a configuration of 512×40, the TLB memory has a configuration of 256×100, the SLB memory has a configuration of 16×64, and the BAT has a configuration of 8×64. Each of these memories is of a different size and a different addressable configuration, i.e., the DCU has significantly more addressable locations than any of the other memories, each of the other memories having smaller addressable space. However, all of the memories, 12, 14, 16, 18 and 20, are single-port memories tested with the same test patterns.

A dual-port, random access memory (RAM) 22 is also provided which also has to be tested with various pattern configurations. A characteristic common to all of the memories 12, 14, 16, 18, 20 and 22, is that whatever data is written into memory can be read out, i.e., the memory locations are readable in the sense that whatever data is stored at a given address location can be read as the data written to that location.

A content addressable memory (CAM) 24 is also provided. The memory 24 is a 512×10 bit memory, with the 512 entries broken up into groups of eight 10-bit comparators. A content addressable memory (CAM) is one in which binary data written therein is stored at the various address locations, but in this embodiment said stored data cannot be directly read out. The Cam memory performs the function of comparing binary data asserted thereon to determine if it has a particular bit pattern stored therein. If a pattern is so stored, the CAM memory responds by outputting an appropriate output signal, e.g., a binary "1", and if the pattern is not stored, a binary "0", on the output of each comparator depending on the data stored. Expressed another way, the CAM memory 24 acts as a comparator in which bits are stored in pre-selected patterns which correspond to portions of an address for another memory, and when a bit pattern is impressed on the CAM 24, the CAM 24 compares the impressed bit pattern with the stored bit patterns to determine if the particular bit pattern is stored, and which one of eight comparators found the bit pattern. Thus, the test function of the CAM requires an inputting of various test data and then performing a compare function between data stored therein and binary test data impressed thereon and determining if the output response is appropriate to indicate such a stored data being present at a given location or not. This will be described presently in conjunction with the operation of the BIST in actuating the CAM.

The various connections between the BIST 10 and the different memories are shown in order to simplify the drawings. Certain inputs are labeled by letters and the corresponding outputs from the BIST are labeled with the letters corresponding to inputs to the various memories, i.e., output A from BIST 10 is input A to DCU 12; output B from BIST 10 is input B to TAG 14, etc. Other signal lines are shown in direct connection and labeled (FIG. 1).

Figure 2A:
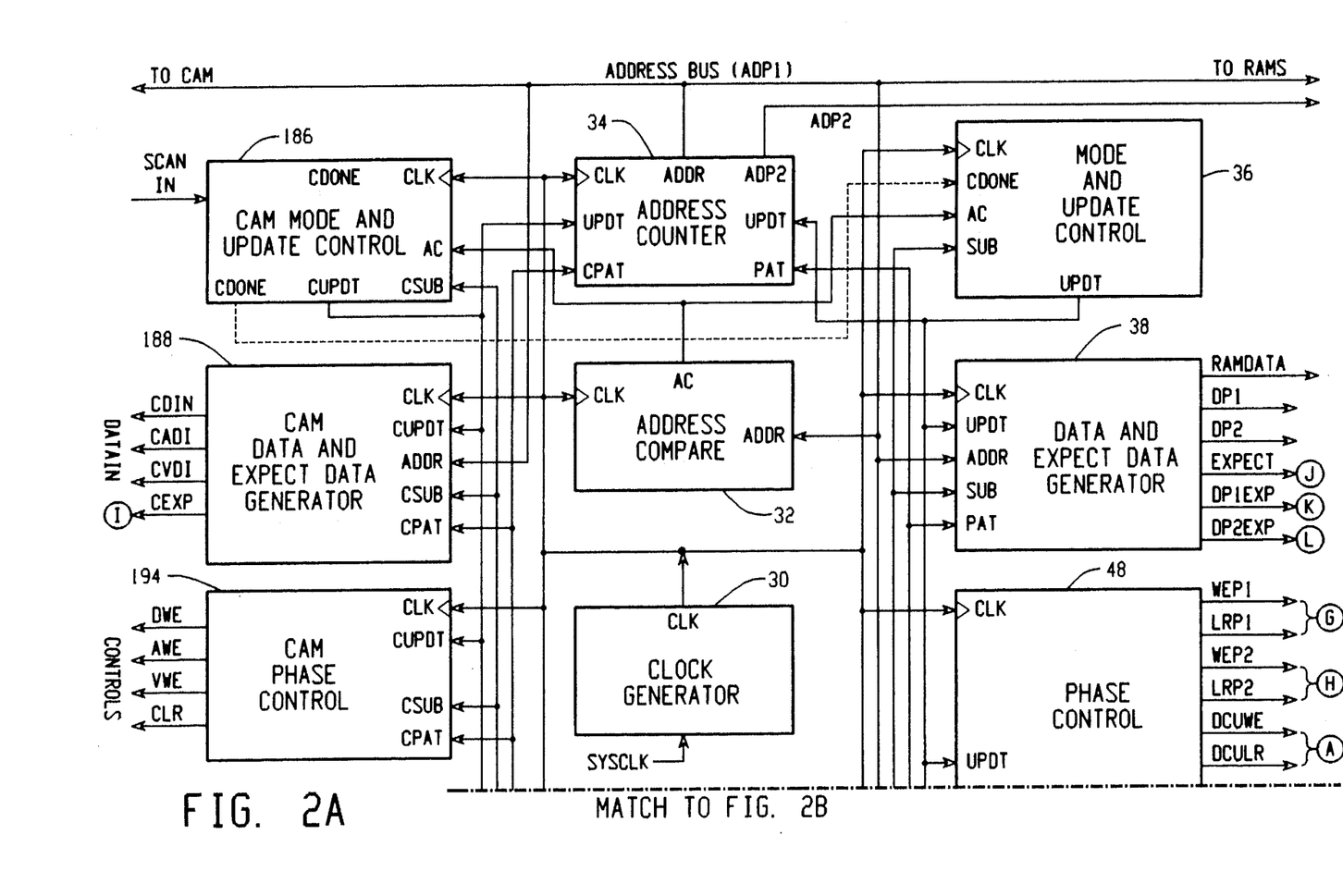
FIGS. 2A and 2B together are a block diagram of a BIST according to this invention, showing the various signals and data paths and buses.
Figure 2B:
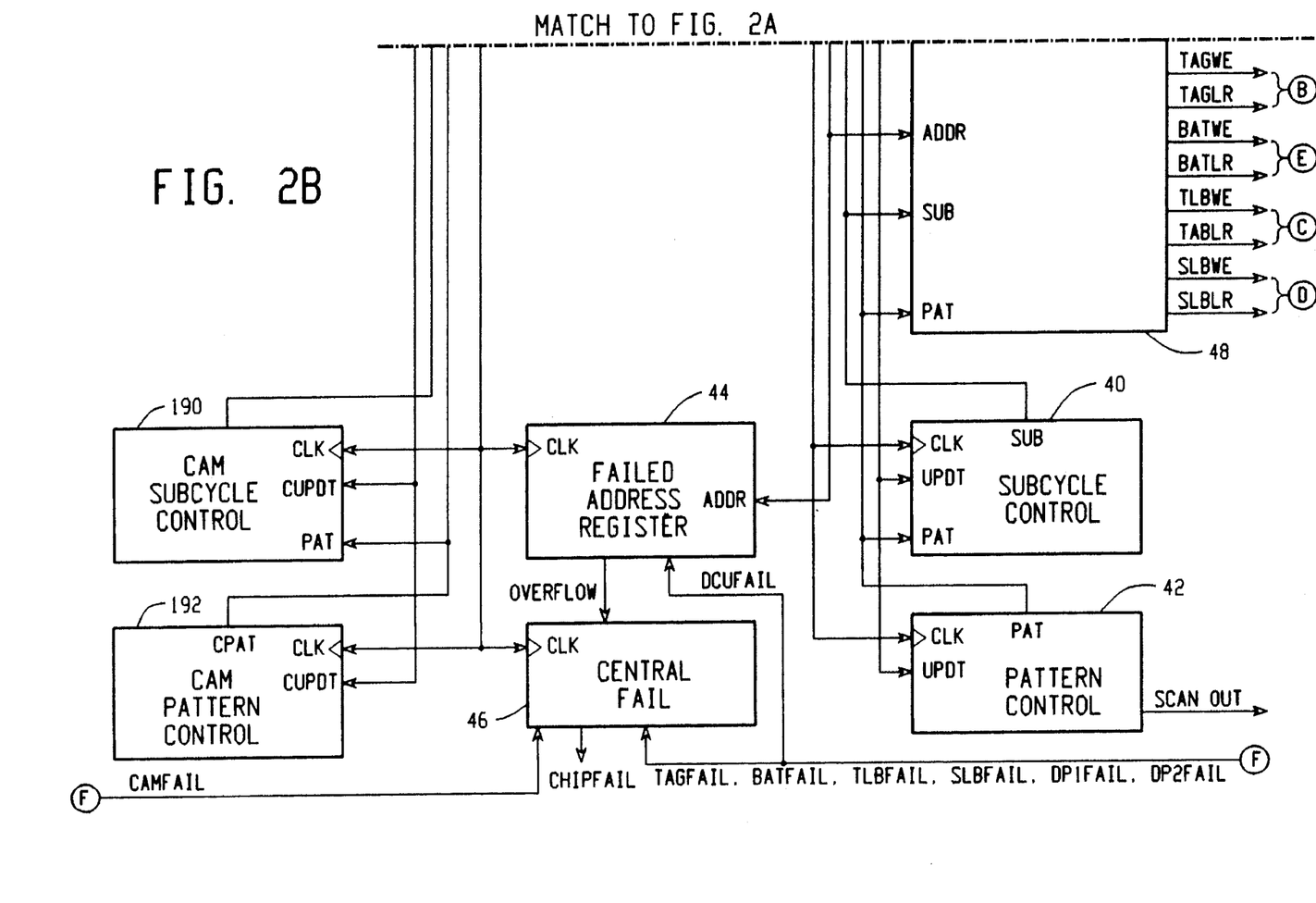

Each of the memories, 12, 14, 16, 18, 20 and 24, have corresponding data compression circuitry which compares memory data outputs with expect data and generates a memory fail signal when a mismatch occurs. These compression circuits are labeled respectively 12a, 14a, 16a, 18a, 20a, and 24a. The dual-port memory RAM 22 has two compression data blocks, one from each port, labeled respectively 22a and 22b. The compression circuitry at the memory output performs a compare of the output data with BIST 10 supplied expect data to generate a single pass/fail bit per memory. The pass/fail bits from the DCU to any other memories utilizing redundancy are sent to the failed address register (FAR) 44 (FIG. 2). The FAR 44 stores the fail bit and its corresponding failed address location. The FAR is designed to store only as many DCU fails as there are redundant word lines. When the FAR is filled and no more redundant word lines are available, an overflow fail bit transfers the fail signal from the FAR to the central fail 46 (FIG. 2) in the BIST 10. All of the other fail bits (TAGFAIL, BATFAIL, TLBFAIL, SLBFAIL, DP1FAIL, DP2FAIL) from the other memories also go to this central fail block 46 (FIG. 2). The address locations of the fails are not stored and neither is the fail bit. These fail bits are further compressed to generate one chip fail signal to be sent off chip. A storage latch (not shown) does exist for each memory without redundancy to store the first fail, if any, that occurs in that memory. Thus, the BIST 10 functions to provide the necessary test information and capture data for seven different memories, each of which has different characteristics and all of which are controlled by the same BIST 10.

Referring now to FIGS. 2A and 2B, a high-level block diagram of the BIST is depicted showing various components. As indicated above, the basic structure of the BIST is the same as that shown in U.S. Pat. No. 5,173,906, to the extent that a state machine is provided which generates data to provide various test patterns which are controlled by the state machine to be written to the memories, load the results, and receive memory pass/fail signals at the central fail block and failing addresses in a failed address register 44. The prior art state machine also contains a phase control function which controls writing test data to, reading the data from, and comparing the read data with the expected data in a single memory.

To this end, a clock generator 30 is provided which receives a clock signal from a system clock (SYSCLK) and which provides the clocking signals for all of the various functions of the state machine. Address compare function 32 is provided, as well as an address counter 34, a mode and update control 36, a data and expect data generator 38, subcycle control section 40, and a pattern control section 42. The BIST 10 also contains the fail address register 44 and central fail storage 46. The clock generator 30, the address compare 32, the address counter 34, and the central fail storage 46 are common to all of the memories to be tested. However, the mode and update control 36, data and expect data generator 38, subcycle control 40, and pattern control 42 are specific to memories 12, 14, 16, 18, 20 and 22. Comparable functions to these are specifically provided for CAM 24, as will be described presently. The system as described so far performs in the same way as the system shown in U.S. Pat. No. 5,173,906, and corresponds to the functions therein designated as the pattern control, the mode control, the subcycle control, phase control, data pattern generator and address counter. It should be noted that the phase control in the U.S. Pat. No. 5,173,906 constitutes a read, write, AS and WGATE, and is specific only to the one memory shown; and only read and write are relevant to this embodiment and will be indicated as global load result and global write enable, respectively, in the present invention. Since these functions are described in detail in the U.S. Pat. No. 5,173,906, they need not be described in great detail here other than to indicate the various signals. A phase control function 48 is provided in this invention to control the writing to and reading of the various memories, as will be described in detail presently. It should be noted, however, that the data and expect data generator, in this case, has a RAM data port and an expect data port as outputs, as well as DP1, DP2 and DP1 expect data and DP2 expect data. This is so that one set of data can be written to the single port memories 12, 14, 16, 18 and 20, and another two sets of data can be written to the dual-port RAM 22, all based on the same state machine and the same pattern and subcycle control. As can be seen in FIG. 2, various signals are provided between the various functional blocks. These signals are as follows:

CLK=clock
CDONE=CAM BIST done
AC=address control
SUB=subcycle control
UPDT=update
ADDR=address
PAT=pattern The system as so far described will function in the manner as described in U.S. Pat. No. 5,173,906. The system is first initialized to a given state. The state machine only requires a clock input to operate after a scan initialization of the latches (not shown). The state machine can be initialized to run all the patterns mentioned previously, except PG by scanning all zeros in the latches. The order in which the patterns are run are as follows: UARW, UARB, CHBD, WLS and BL. Other data can be scanned in to limit the address space, cause looping on one pattern or subcycle, to invoke the programmable pattern, etc.

The state machine will then go through the cycles representing each of the patterns to be written successively and will generate any failure data. Each pattern is comprised of a series of subcycles which implement the necessary write and load result operations to write and read the various patterns applied to the memories in test mode. Each of these write and read operations in each pattern, and each subcycle will be based on the memory with the largest address space to be written, which in this case is the DCU memory 12. At the end of each subcycle, the next subcycle is commenced, and thereafter through all of the subcycles for each pattern and then onto the next pattern with the subcycles therein for the various patterns which can be generated. As indicated in the U.S. Pat. No. 5,173,906, these patterns for a memory may typically be unique address ripple word (UARW), unique address ripple bit (UARB), checkerboard (CHBD), wordline stripe (WLS), blanket (BL) and programmable (PG) patterns. These same patterns will be generated by the portion of the state machine which has just been described, and the global write enable and global load result signals are generated until all of the patterns are applied and the data read and results loaded.

However, as indicated above, the various memories have different configurations and thus, during each pattern and subcycle, depending on the memory and the number of addressable locations, asserting the LR and WE signals is not performed because they are beyond the address space. Indeed, the DCU memory has address locations and capabilities beyond the capabilities of all the other memories 14, 16, 18, 20 and 22, and thus for certain address locations which must be written to the DCU memory, these same address locations must be deactivated with write enable and load results in these memories which do not have this address range capability. Moreover, the dual-port memory 22 requires a special type of read and write enable to address both of the dual ports as will be described presently. Thus, the input from the subcycle control 40 generates the write enable and load result signals which are the global write enable and global load result. U.S. Pat. No. 5,173,906 describes in some detail the circuits and the tables for writing each of the various patterns, including the circuits and tables for writing the "1"s, "0"s and the various states such as true data ascending, complimentary data ascending, true data descending, complimentary data descending, and then the specific read/write signals shown in FIGS. 2A and 2B thereof for the various patterns. In any event, the output of the state machine for the write enable and load results is writing individual "1"s and "0"s onto the bus which is indicated in FIG. 3 hereof, global write enable (GBWE) and global load results (GBLR) signals.

Figure 3A:
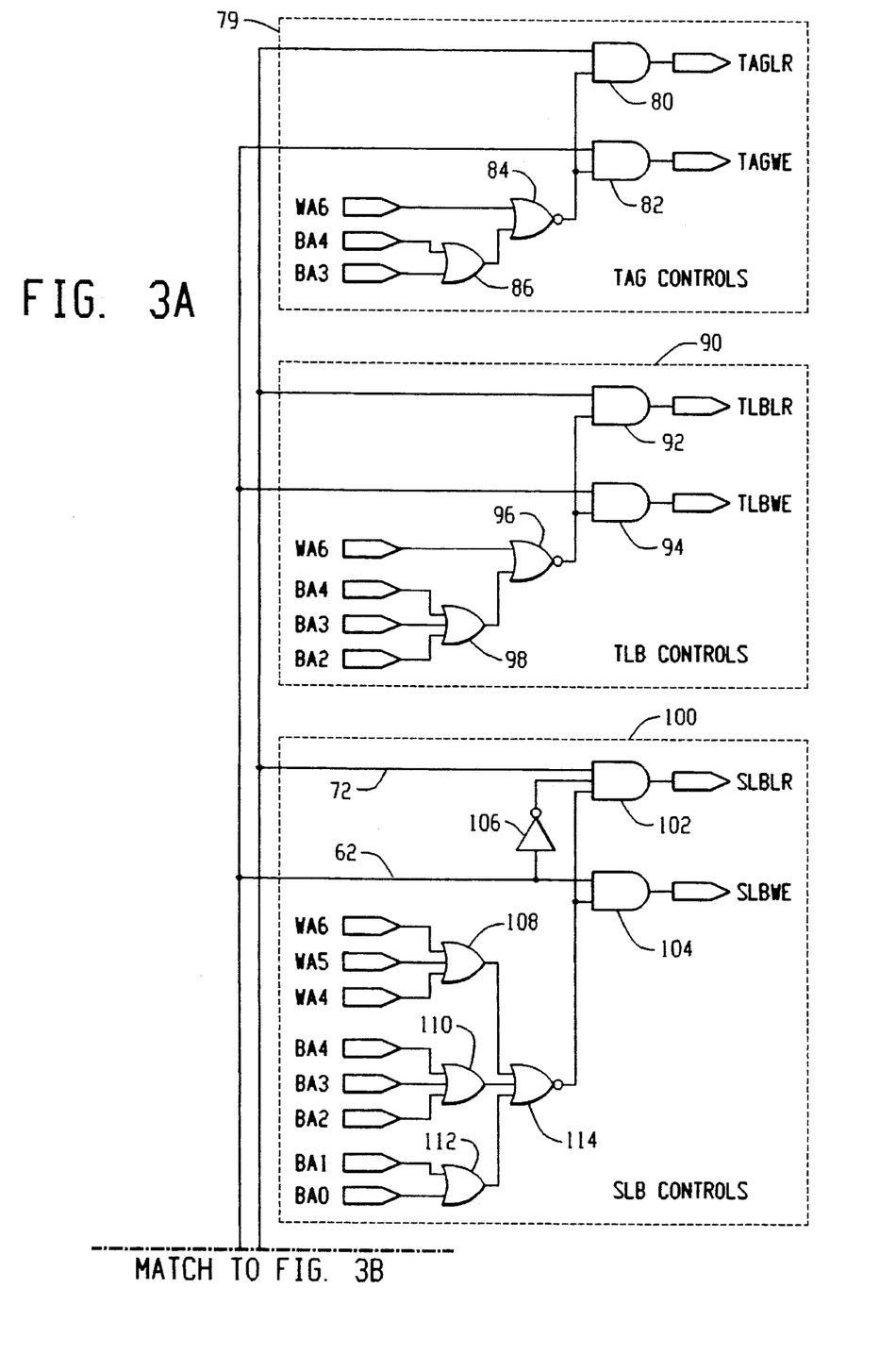
FIGS. 3A and 3B together are a diagrammatic representation of a portion of the BIST that controls the reading, writing and output compression of memories with differing characteristics.
Figure 3B:
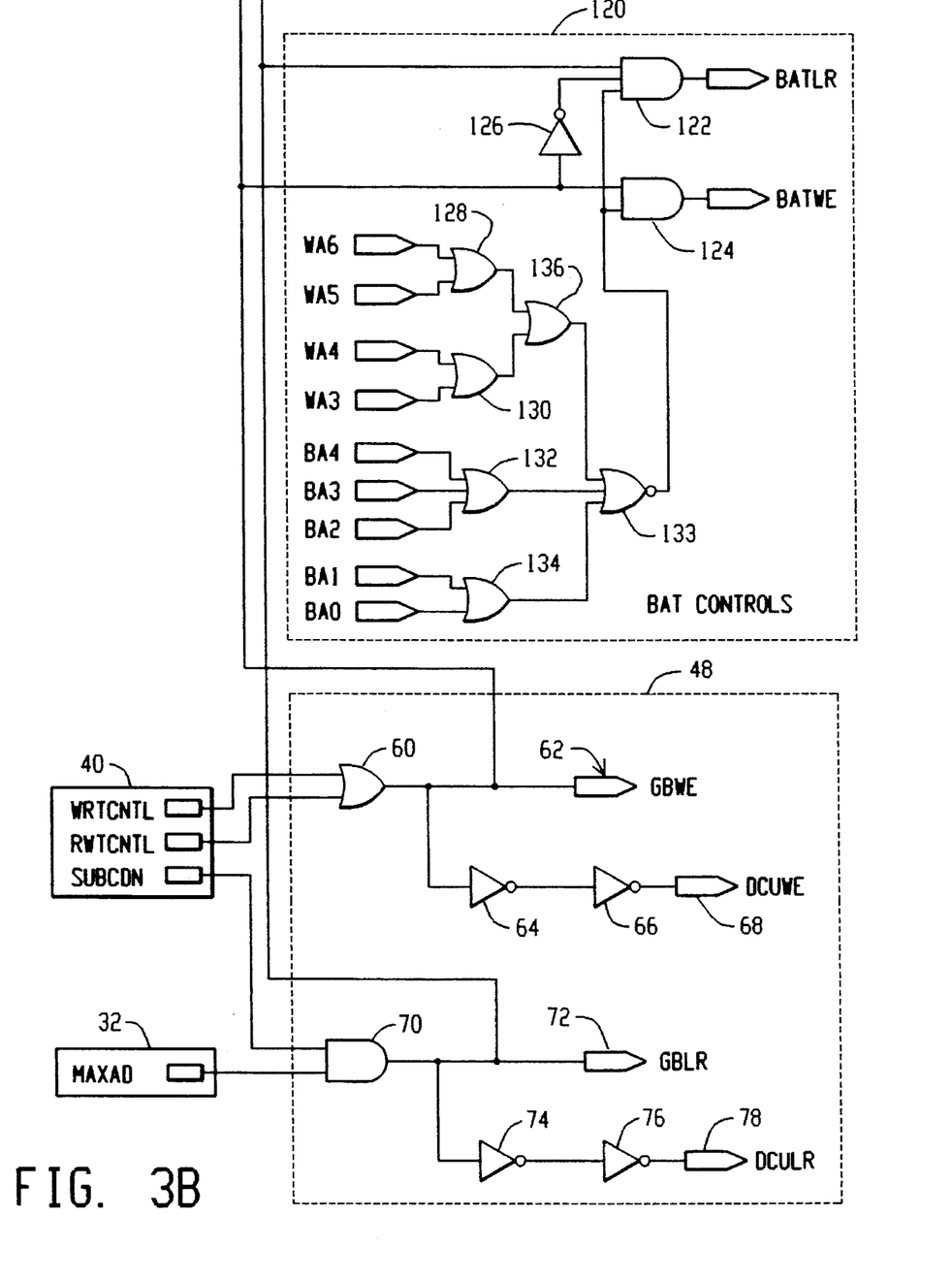

Referring now to FIGS. 3A and 3B, inputs from the subcycle control 40 and address compare 32 are provided to the phase control 48. The input to the phase control 48 from the subcycle control 40 constitutes write control (WRTCNTL) signal and read/write control (RWTCNTL) signal impressed on OR gate 60 which generates a global write enable signal (GBWE) at port 62. Output from the gate 60 is delivered to a pair of inverters 64 and 66 to a DCU write enable port 68 which supplies the write enable signal for the DCU memory 12. The subcycle control 40 also generates subcycle done (SUBCDN) signal which together with the maximum address (MAXAD) signal generated by address compare 32 are asserted on NAND gate 70 which generates a global load result signal input 72. The same NAND gate 70 also impresses the output signal thereof upon a pair of inverters 74 and 76, which outputs a load result signal "DCULR" at port 78 which supplies the load result signal for the DCU memory 12. In this embodiment, the DCU memory 12 has the largest number of word addresses and bit addresses, and thus the cycles and subcycles of the state machine are programmed to go through all of the cycles and subcycles necessary to completely write all of the patterns to the DCU memory 12. However, the TAG memory 14, the TLB memory 16, the SLB memory 18, and the BAT memory 20 all have less than the number of word addresses and bit addresses in the DCU memory, and so the remainder of the signals from the phase control are for the purpose of disabling or shutting off writing to or loading the results of a compare between read and expect data once the full address space has been exercised.

The global write enable port 62 and the global load result port 72 provide the inputs to the various sections of the phase controller 48 to control the TAG memory 14, TLB memory 16, the SLB memory 18, and the BAT memory 20. These controls operate by disabling, writing and loading the compression results of reads once the memory space is exceeded. Generally, this is done by providing logic which combines with the global write enable and global load results to prevent active signals from being impressed on the write enable or load result lines to these unavailable addresses.

With respect to the controlling of the TAG memory, this logic is shown in the region outlined and designated with the reference character 79. The global load result port 72 is connected to one input of AND gate 80, and the global write enable port 62 is connected to one input of AND gate 82. The addressing of the memories is accomplished by using word address inputs (WA) and bit address inputs (BA) which comprise the address bus. In this case, there are seven WAs, i.e., WA0–WA6, and five BAs, i.e., BA0–BA4. As is known to those skilled in the art, this provides 128 word locations and 32 bit locations. The signals on the WA and BA lines are generated by the address counter 34. The logic 79 also includes input from WA6, and BA4 and BA3. WA6 is connected to one input of the NOR gate 84, BA4 and BA3 are connected to the inputs of OR gate 86, the output of which is connected to the other input of NOR gate 84. The output from the NOR gate 84 is applied to the inputs of both AND gate 80 and AND gate 82. During the first eight bit locations and first 64 wordlines, WA6 and BA4 and BA3 are normally low and hence not actuated. Thus, a high signal is provided from the output of both the AND gate 82 and the AND gate 80, allowing a write operation and a load result operation to occur by allowing TAGWE and TAGLR to occur. When the WA6 line and both BA3 and BA4 are inactive, write enable and load result functions are performed to the TAG memory if GBWE 62 and GBLR 72 are asserted. When, however, during the subcycle of any particular pattern the WA6, BA4 or BA3 are activated, the logic of the gates 84 and 86 will provide an inverted output signal from the NOR gate 84 which will turn off both the TAG write enable (TAGWE) and the TAG load result (TAGLR) functions. Thus, when the BIST 10 is writing to the address targeted by all word address inputs and bit address inputs other than when WA6, BA4 and BA3 are high, the data is being written to and the results loaded from these addresses in both the DCU and TAG memories. However, when data is being written to locations which are actuated by either WA6, or BA4 or BA3, this data will be written to and the results loaded in the DCU memory 12, but not in the TAG memory 14, since the control lines to the TAG memory have been disabled or turned off during this portion of either the write cycle or the load result cycle. Thus, during a single write, those memories which are addressable will be written, and those memories which are not addressable will be turned off. Similarly, during a load result, which require data to be read for that pattern have the results loaded, and those which do not require data to be read during that pattern which are also not addressable have the load result turned off.

In the same fashion, the controls to the TLB memory 16 are similarly governed as shown in block 90. For control of the load result and write enable accessing of a TLB memory 16, AND gate 92 receives as one input the signal from global load result port 72 and AND gate 94 receives as one input, the signal from the global write enable port 62. NOR gate 96 provides the other inputs to AND gates 94 and 92. One input to the NOR gate 96 is from WA6. BA4, BA3 and BA2 provide input to OR gate 98, the output of which provides the other input to NOR gate 96. The testing of the TLB memory is similar to that of the TAG memory in that whenever there is a write enable or load result to an address which does not require the assertion of WA6 or BA4, or BA3, or BA2, the write to or load result from the address will take place. However, when during the subcycle, addresses requiring the activation of WA6, or BA4, or BA3, or BA2, are accessed, the logic of gates 96 and 98 will provide a signal to the AND gates 92 and 94 to prevent attempted writing to these addresses or loading results from these addresses, just as described with respect to the TAG memory 14. It should be noted that, in the case of the TAG memory 14 and the TLB memory 16, these are of the type known as write-through memories; i.e., that the memories can be read as they are being written. Thus, the memory stores the data written, as well as provides the same data to its output. Hence, during a write cycle, reading also takes place, and thus both the write enable and load result lines can be enabled during write operations.

The control logic of the SLB memory is shown as outlined at reference character 100 and operates similarly but with a slight modification to the operation of the logic controls of the write enable and load results for the TAG memory 14 and TLB memory 16. The global load result port 72 provides one signal input to AND gate 102, and the global write enable port 62 provides one input to AND gate 104. An inverter 106 is interposed between the global write enable port 62 and the AND gate 102 to disable the load result function when the write enable function is active for a purpose which will be described presently. WA6, WA5 and WA4 ports provide the inputs to OR gate 108; BA4, BA3 and BA2 provide the inputs to OR gate 110; and BA1 and BA0 provide the inputs to OR gate 112. The outputs from OR gates 108, 110 and 112 provide the inputs to NOR gate 114, the output of which provides the other inputs to AND gates 102 and 104. As with the TAG and TLB memories, when the global write enable 62 is active and any of the word addresses or bit addresses are selected such that WA6, WA5, WA4, BA4, BA3, BA2, BA1 and BA0 are inactive, the write function will take place to the SLB. However, the inverter 106 will prevent the SLB load result from taking place while a write operation is being performed because inverter 106 will invert the write enable signal from the global write enable port 62 to AND gate 102, which will prevent a high output from AND gate 102 which drives the load results port SLBLR. However, if the global write enable 62 is not active and the current address does not require the assertion of any of the address inputs to logic block 100 (WA6-WA4, BA4-BA0), then a load result will occur if the global load result 72 is asserted. If any of these word addresses or bit addresses shown in 100 are active, the signal from the NOR gate 114 will prevent a write enable signal from being outputted from the AND gate 104 and will prevent a load result enable signal from being outputted from the AND gate 102.

The logic circuitry for the BAT memory 20 is similar to that for the SLB memory 18 and is shown in the block designated by the reference character 120. This includes an AND gate 122 which has as one input the signal from the global load result terminal or port 72 and an AND gate 124 which has as one input the signal from the global write enable port 62. An inverter 126 is connected between the global write enable port 62 and one input of the AND gate 122. WA6 and WA5 lines provide inputs to OR gate 128; WA4 and WA3 ports provide inputs to OR gate 130; BA4, BA3 and BA2 ports provide inputs to OR gate 132; BA1 and BA0 ports provide input to OR gate 134. The outputs from OR gates 128, and 130 provide the inputs to OR gate 136. The output from OR gates 136, 132 and 134 provide the inputs to NOR gate 138. The output from the NOR gate 138 provides the other inputs to the AND gates 122 and 124. The operation of the logic 120 for controlling the write enable and load result to the BAT memory is similar to that for the SLB memory. Also, the BAT memory, as is the case with the SLB memory, is not a write-through memory, and thus the inverter 126 is necessary to disable the load result signal driven by AND gate 122 if the write enable is active.

It is to be understood that the word address inputs and the bit address inputs control a multiplicity of memory cell locations being written or read. Table I below shows an illustration in matrix form as to how this works for the TAG memory 14.

TABLE I

| Wordline | WA6 | WA5 | WA4 | WA3 | WA2 | WA1 | WA0 | BA4 | BA3 | BA2 | BA1 | BA0 | Bitline | W/E & L/R Active |
|---|---|---|---|---|---|---|---|---|---|---|---|---|---|---|
| 0 | 0 | 0 | 0 | 0 | 0 | 0 | 0 | 0 | 0 | 0 | 0 | 0 | 0 | X |
| 0 | 0 | 0 | 0 | 0 | 0 | 0 | 0 | 0 | 0 | 0 | 0 | 1 | 1 | X |
| 0 | 0 | 0 | 0 | 0 | 0 | 0 | 0 | 0 | 0 | 0 | 1 | 0 | 2 | X |
| 0 | 0 | 0 | 0 | 0 | 0 | 0 | 0 | 0 | 0 | 0 | 1 | 1 | 3 | X |
| 0 | 0 | 0 | 0 | 0 | 0 | 0 | 0 | 0 | 0 | 1 | 0 | 0 | 4 | X |
| 0 | 0 | 0 | 0 | 0 | 0 | 0 | 0 | 0 | 0 | 1 | 0 | 1 | 5 | X |
| 0 | 0 | 0 | 0 | 0 | 0 | 0 | 0 | 0 | 0 | 1 | 1 | 0 | 6 | X |
| 0 | 0 | 0 | 0 | 0 | 0 | 0 | 0 | 0 | 0 | 1 | 1 | 1 | 7 | X |
| 0 | 0 | 0 | 0 | 0 | 0 | 0 | 0 | 0 | 1 | 0 | 0 | 0 | 8 | |
| 0 | 0 | 0 | 0 | 0 | 0 | 0 | 0 | 0 | 1 | 0 | 0 | 1 | 9 | |
| 0 | 0 | 0 | 0 | 0 | 0 | 0 | 0 | 0 | 1 | 0 | 1 | 0 | 10 | |
| 0 | 0 | 0 | 0 | 0 | 0 | 0 | 0 | 0 | 1 | 0 | 1 | 1 | 11 | |
| 0 | 0 | 0 | 0 | 0 | 0 | 0 | 0 | 0 | 1 | 1 | 0 | 0 | 12 | |
| 0 | 0 | 0 | 0 | 0 | 0 | 0 | 0 | 0 | 1 | 1 | 0 | 1 | 13 | |
| 0 | 0 | 0 | 0 | 0 | 0 | 0 | 0 | 0 | 1 | 1 | 1 | 0 | 14 | |
| 0 | 0 | 0 | 0 | 0 | 0 | 0 | 0 | 0 | 1 | 1 | 1 | 1 | 15 | |
| 0 | 0 | 0 | 0 | 0 | 0 | 0 | 0 | 1 | 0 | 0 | 0 | 0 | 16 | |
| 0 | 0 | 0 | 0 | 0 | 0 | 0 | 0 | 1 | 0 | 0 | 0 | 1 | 17 | |

TABLE I-continued

| Wordline | WA6 | WA5 | WA4 | WA3 | WA2 | WA1 | WA0 | BA4 | BA3 | BA2 | BA1 | BA0 | Bitline | W/E & L/R Active |
|---|---|---|---|---|---|---|---|---|---|---|---|---|---|---|
| 0 | 0 | 0 | 0 | 0 | 0 | 0 | 0 | 1 | 0 | 0 | 1 | 0 | 18 | |
| 0 | 0 | 0 | 0 | 0 | 0 | 0 | 0 | 1 | 0 | 0 | 1 | 1 | 19 | |
| 0 | 0 | 0 | 0 | 0 | 0 | 0 | 0 | 1 | 0 | 1 | 0 | 0 | 20 | |
| 0 | 0 | 0 | 0 | 0 | 0 | 0 | 0 | 1 | 0 | 1 | 0 | 1 | 21 | |
| 0 | 0 | 0 | 0 | 0 | 0 | 0 | 0 | 1 | 0 | 1 | 1 | 0 | 22 | |
| 0 | 0 | 0 | 0 | 0 | 0 | 0 | 0 | 1 | 0 | 1 | 1 | 1 | 23 | |
| 0 | 0 | 0 | 0 | 0 | 0 | 0 | 0 | 1 | 1 | 0 | 0 | 0 | 24 | |
| 0 | 0 | 0 | 0 | 0 | 0 | 0 | 0 | 1 | 1 | 0 | 0 | 1 | 25 | |
| 0 | 0 | 0 | 0 | 0 | 0 | 0 | 0 | 1 | 1 | 0 | 1 | 0 | 26 | |
| 0 | 0 | 0 | 0 | 0 | 0 | 0 | 0 | 1 | 1 | 0 | 1 | 1 | 27 | |
| 0 | 0 | 0 | 0 | 0 | 0 | 0 | 0 | 1 | 1 | 1 | 0 | 0 | 28 | |
| 0 | 0 | 0 | 0 | 0 | 0 | 0 | 0 | 1 | 1 | 1 | 0 | 1 | 29 | |
| 0 | 0 | 0 | 0 | 0 | 0 | 0 | 0 | 1 | 1 | 1 | 1 | 0 | 30 | |
| 0 | 0 | 0 | 0 | 0 | 0 | 0 | 0 | 1 | 1 | 1 | 1 | 1 | 31 | |
| 0 | 0 | 0 | 0 | 0 | 0 | 0 | 1 | 0 | 0 | 0 | 0 | 0 | 0 | X |
| 0 | 0 | 0 | 0 | 0 | 0 | 0 | 1 | 0 | 0 | 0 | 0 | 1 | 1 | X |
| 1 | 0 | 0 | 0 | 0 | 0 | 0 | 1 | 0 | 0 | 0 | 1 | 0 | 2 | X |
| 1 | 0 | 0 | 0 | 0 | 0 | 0 | 1 | 0 | 0 | 0 | 1 | 1 | 3 | X |
| 1 | 0 | 0 | 0 | 0 | 0 | 0 | 1 | 0 | 0 | 1 | 0 | 0 | 4 | X |
| 1 | 0 | 0 | 0 | 0 | 0 | 0 | 1 | 0 | 0 | 1 | 0 | 1 | 5 | X |
| 1 | 0 | 0 | 0 | 0 | 0 | 0 | 1 | 0 | 0 | 1 | 1 | 0 | 6 | X |
| 1 | 0 | 0 | 0 | 0 | 0 | 0 | 1 | 0 | 0 | 1 | 1 | 1 | 7 | X |
| 1 | 0 | 0 | 0 | 0 | 0 | 0 | 1 | 0 | 1 | 0 | 0 | 0 | 8 | |
| : | : | : | : | : | : | : | : | : | : | : | : | : | : | : |
| 63 | 0 | 1 | 1 | 1 | 1 | 1 | 1 | 1 | 1 | 1 | 0 | 1 | 29 | |
| 63 | 0 | 1 | 1 | 1 | 1 | 1 | 1 | 1 | 1 | 1 | 1 | 0 | 30 | |
| 63 | 0 | 1 | 1 | 1 | 1 | 1 | 1 | 1 | 1 | 1 | 1 | 1 | 31 | |
| 64 | 1 | 0 | 0 | 0 | 0 | 0 | 0 | 0 | 0 | 0 | 0 | 0 | 0 | |
| 64 | 1 | 0 | 0 | 0 | 0 | 0 | 0 | 0 | 0 | 0 | 0 | 1 | 1 | |
| 64 | 1 | 0 | 0 | 0 | 0 | 0 | 0 | 0 | 0 | 0 | 1 | 0 | 2 | |
| 64 | 1 | 0 | 0 | 0 | 0 | 0 | 0 | 0 | 0 | 0 | 1 | 1 | 3 | |
| 64 | 1 | 0 | 0 | 0 | 0 | 0 | 0 | 0 | 0 | 1 | 0 | 0 | 4 | |
| 64 | 1 | 0 | 0 | 0 | 0 | 0 | 0 | 0 | 0 | 1 | 0 | 1 | 5 | |
| 64 | 1 | 0 | 0 | 0 | 0 | 0 | 0 | 0 | 0 | 1 | 1 | 0 | 6 | |
| 64 | 1 | 0 | 0 | 0 | 0 | 0 | 0 | 0 | 0 | 1 | 1 | 1 | 7 | |
| 64 | 1 | 0 | 0 | 0 | 0 | 0 | 0 | 1 | 0 | 0 | 0 | 0 | 8 | |
| : | : | : | : | : | : | : | : | : | : | : | : | : | : | : |

Referring now to Table I, this shows seven word addresses WA0–WA6 associated with five bit addresses BA0–BA4 and how the actuation of the word address WA and the bit address BA either activate or do not activate the TAG "load results" (L/R) and "write enable" (W/E) functions. In Table I, the address counter is incrementing through address locations in ripple bit mode—bit address is incrementing faster than word address. The column at the far right titled "W/E & L/R Active" indicates by an "X" at which addresses TAGWE and TAGLR are asserted. It is to be understood that during read operations, only the load result signal would be asserted at the addresses marked with an "X". With respect to Table I, TAG memory 14 locations will be written to or read from unless either WA6 or BA4 or BA3 has gone high or active, which shuts off the load result and write enable. It can be seen at Bitline locations 0, 1, 2, 3, 4, 5, 6 and 7 when WA6 is not active, that neither BA3 nor BA4 are active. Since WA6, BA4, and BA3 are all inactive, there will be active "load result" and "write enable" signals provided to the TAG memory 14 at Bitline locations 0–7. However, for Bitline locations 8–31, either one or both of the bit address lines BA3 or BA4 is high as shown by the logic "1" in Table I, and thus the OR gate 86 and NOR 84 turns off both the TAG load result and TAG write enable through AND gates 80 and 82 and prevents or disables write enable and load result. Hence, at Wordline 0, the TAG receives active write enable and load result signals at Bitline locations 0–7, and TAGWE=0 and TAGLR=0 at Bitline locations 8–31.

The address counter then increments to the next row, wherein WA0 becomes active ("1"), and BA4-0 are all reset ("0"), thus allowing a load result and write enable to occur at this address (Wordline 1, Bitline 0) and at the next seven addresses (Wordline 1, Bitlines 1–7) as indicated by the second set of eight "X"ed boxes in Table I. However, TAGLR and TAGWE are inactivated during the next 24 address locations, Wordline 1, Bitlines 8–31 (only Wordline 1, Bitline 8 is shown in Table I) as was the case at Wordline 0 since BA3 and/or BA4 is active. This pattern of "write enable" and "load result" being active in Bitline locations 0–7 and being inactive in Bitline locations 8–31 is repeated as the address counter increments up through the address space. It is not until WA6 goes active that this repetition is broken and TAGWE and TAGLR remain inactive for the remainder of the address space. Note the blank boxes in the "W/E & L/R Active" column of Table I at addresses Wordline 64, Bitlines 0–7. It is understood that this table is merely illustrative of how the disabling of the write enable and load results functions work and is a function of the matrix and depends on whether there is an active signal on any of the given word address WA6, or bit address BA3 or BA4 which provide the active signal to disable the load result and writing through OR gate 86 and NOR gate 84 and AND gates 80 and 82. The other memories, 16, 18 and 20, operate the same way. Of course, DCU memory 12 does not require any alternate disabling since the full range of addresses generated by the BIST 10 is actuatable.

To summarize, a single state machine of the type described in U.S. Pat. No. 5,173,906 generates the necessary write enable and load result signals, together with the write data and expect data based on the most extensive address, which in this case is on the DCU memory. The phase control circuit manages the write enable and load result signals for each memory, such that when an address dimension, i.e, either word or bit dimension, is exceeded, the write enable and load result signals are turned off. When this occurs, these smaller memories are not written but may be read, however, the outputs are not compared to expect data. The transitions from write enable/load result being active to inactive and inactive to active can occur multiple times within a subcycle. For example, the column dimension can be exceeded when in ripple bit mode, but once the maximum bit addressing is reached for the largest memory, then the bit addressing returns to "0" while the word address is incremented. Thus, the write enable/load result signals could become inactive during the upper order column or bit decode, but would become reactivated when the word address is incremented and the bit location returns to "0". A variant of this would take place if the address space was being decremented.

When the data is read from the various address locations and the load result line is actuated, the anticipated data out generated by the BIST state machine is supplied to each of the data compression circuits 12a, 14a, 16a, 18a and 20a in each of the memories, and a comparison is made to determine if the data read from the particular memory corresponds to the expect or anticipated data, and any error signals, from 12a, are delivered to failed address register 44 and from 12a, 14a, 16a, 18a and 20a to the central fail 46. At this point, either the memory can be repaired by employing redundant address rows if such are present in the memory, or otherwise the chip will have to be scrapped or other provision made to compensate for the recorded error.

Figure 4:
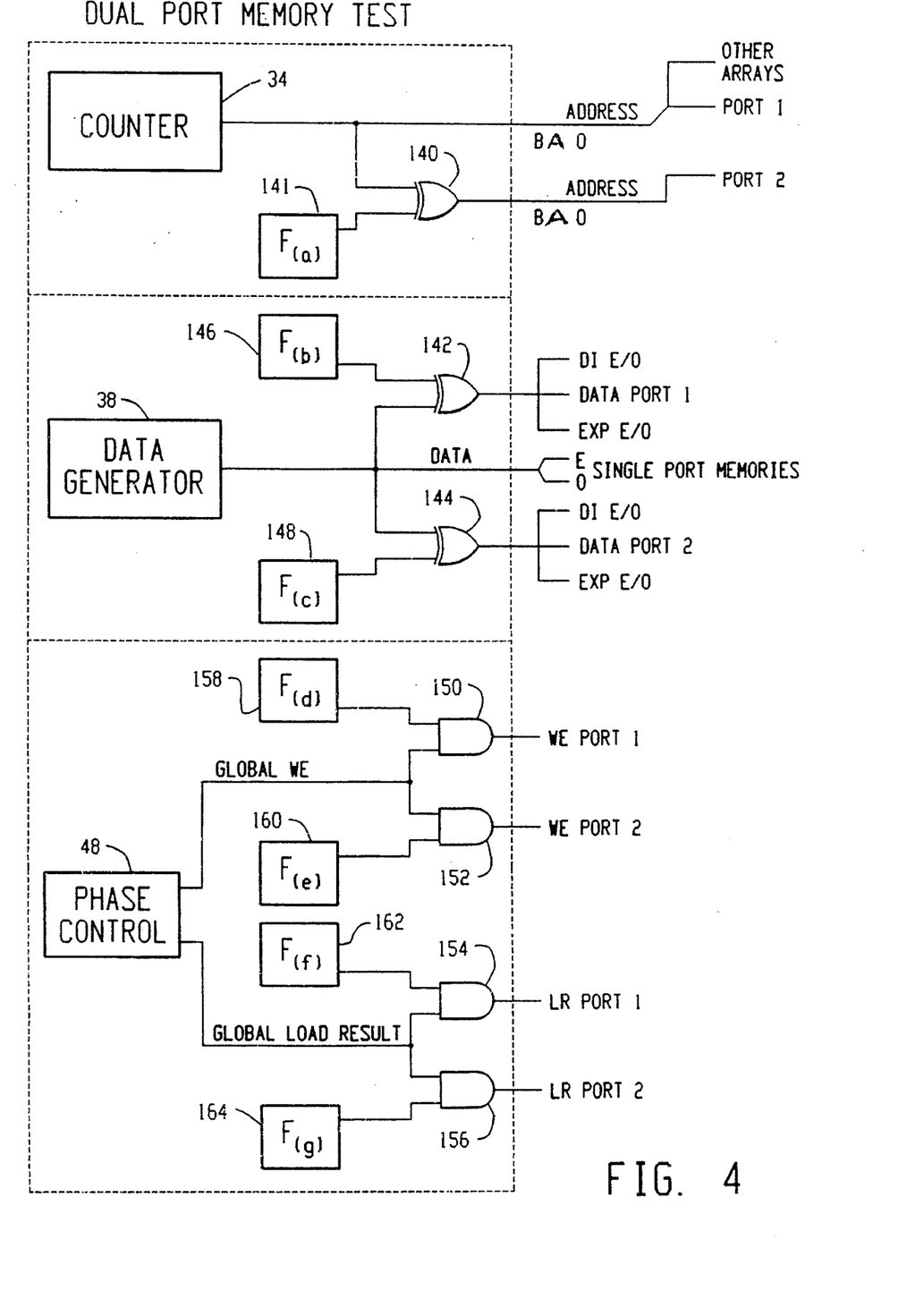
FIG. 4 is a diagram of BIST controls for testing a dual-port RAM.

The operation of the BIST 10 with respect to the dual-port RAM 22 is as it is with respect to the single-port memories 12, 14, 16, 18 and 20, except that the data has to be supplied to each of the ports of the dual-port memory to provide for proper testing. The same data generated for the single-port memories is manipulated logically and provided to port 1 and port 2 of RAM 22. This logical manipulation is shown in FIG. 4. As can be seen in FIG. 4, the BA0 output of the counter is provided on the port 1 address bus, and is also supplied to XOR gate 140 where it is selectively inverted depending on the functional input 141. Function 141 controls whether or not both ports get the same or different addresses dependent on the customized algorithmic pattern that needs to be applied to the two-port memory. Output from the counter 34 goes unmodified to port one (P1) of the dual-port RAM 22 (and also to all of the other memories), which provide the addresses for the other memories. The XORed data is supplied to port two of the dual-port array.

The data and expect data generator 38 generates data for the dual-port memory 22, the data from the data generator 38 is supplied as one input to XOR gate 142 and also as one input to XOR gate 144. The data from the data generator that is supplied to XOR gate 142 is XORed with logic function 146, and the data from the data generator 38 is supplied to XOR gate 144 and is XORed with logic function 148. The output from the XOR gate 142 is supplied as the data input to port one, both as data input and expect data, and the output of XOR gate 144 is outputted as data to data port two, both as data input and expect data. Again, functions 146 and 148 control whether or not the port data is inverted from the normal data provided to the single-port RAMs and is dependent on the customized algorithmic pattern that needs to be applied to the two-port memory. Phase control 48 works in a similar manner in that global write enable 62 is supplied to AND gates 150 and 152. The output from AND gate 150 is the write enable to port one, and the output from AND gate 152 in the write enable to port two. Similarly, the global load result 72 is supplied as one input to AND gate 154 and also as one input to AND gate 156. The input to AND gate 150 is ANDed with function 158, the input to AND gate 152 is ANDed with function 160, the input to AND gate 154 is ANDed with function 162, and the input to AND gate 156 is ANDed with function 164. Functions 158 and 160 disable writing to one or both of the ports, and functions 162 and 164 allow results to be received from one and/or both ports. These functions again are dependent on the custom algorithmic pattern that needs to be applied to the two-port memory. These function inputs correspond to the outputs from the phase control where the single port write enable and load result are activated, depending upon whether the space is addressable or not, and thus logic dependent on the word address WA or bit address BA are active or not for write enable and load result. In other respects, the write enable and load results are the same as for single-port memory, except as modified to control the two-port memory.

To customize an algorithmic pattern for a two-port memory, a partial unique address ripple word (UARW) pattern is used as an example. The memory 22 is first written using one or two ports, to an "all zero" state as an example. Then while, say port one does a read "0", write "1", read "1" on the first even address, the other port (port two) does a read "0", read "0", read "0" on the first odd address. In this example, port one tests the even locations before port two reads the odd locations. Whenever port two reads data from the memory 24 after it has been modified by port one, it must now read "1"s out of the array. As the counter counts, the addresses change and port one does the read "0", write "1", read "1" to the whole array, while port two does a read "0", read "0", read "0" to all unmodified addresses and a read "1", read "1", read "1" to all addresses modified by port one.

In the above pattern, the addresses for the two ports had to be different. The compare data for port two was different from port one and was also modified by the odd/even address bit. The two ports were performing the different read, write operations to the memory 22.

As in the previous embodiments, the data is compared in the port one compression section 22a and port two compression section 22b, and then supplied to central fail 46.

As indicated earlier, the CAM memory 24 is somewhat different in nature from the DCU 12, TAG 14, TLB 16, SLB 18, BAT 20 and dual-port RAM 22 memories in that the CAM memory 24, while storing data and thus able to have data written thereto, does not have the capability of having the stored data read therefrom, but rather acts as a comparator to compare bit patterns supplied thereto to see if that particular bit pattern is stored therein. The CAM memory 24 in one conventional configuration is a 512×10 memory arranged in such a way that there are 64 wordlines of 80 bits each, with each of the 80 bits being segmented into eight 10-bit segments which are to be tested. This is depicted generally in FIG. 5, but showing only 16 bits wide with four 4-bit segments for illustrative purposes.

Figure 5:
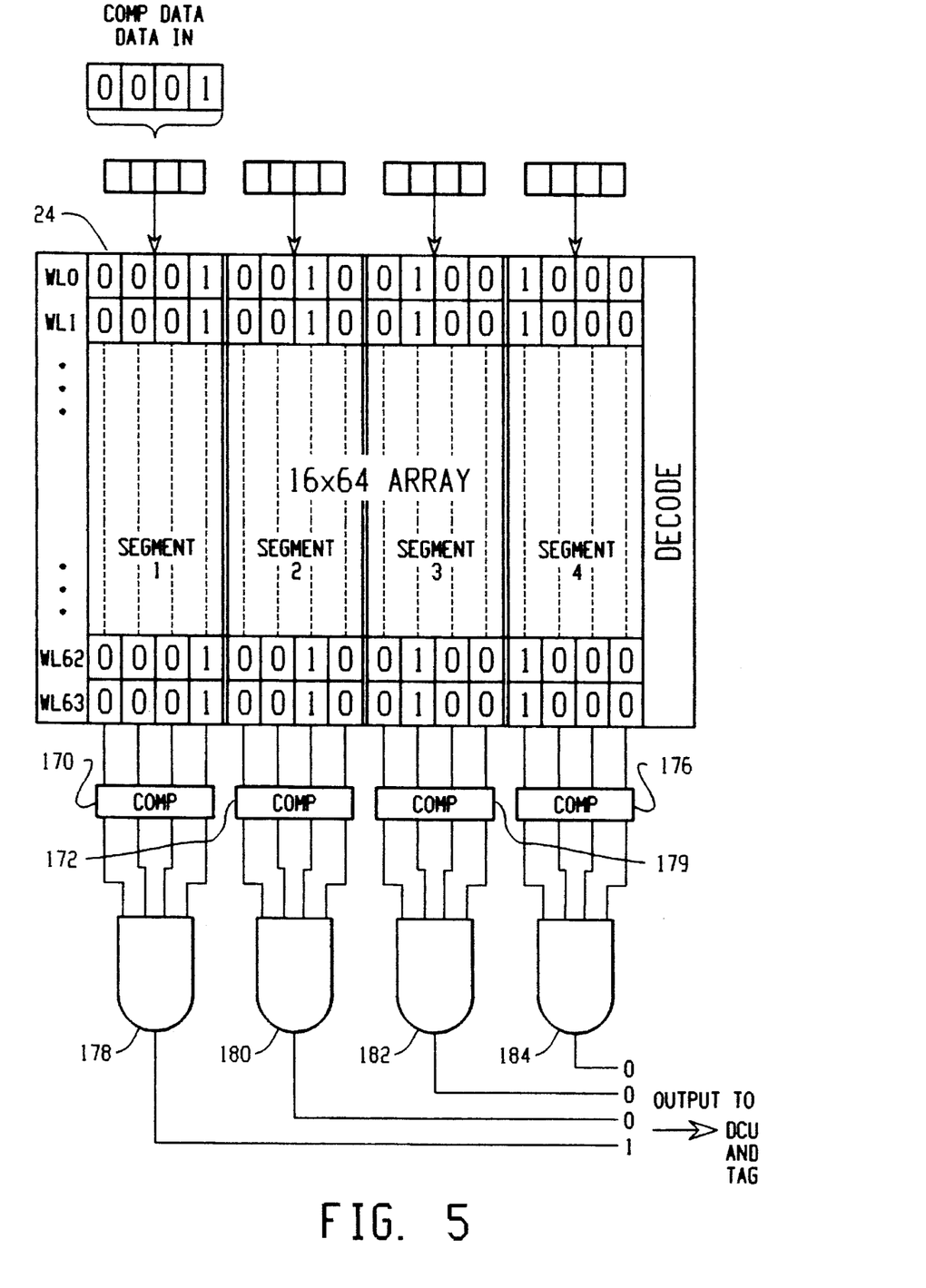
FIG. 5 is a diagrammatic representation of one embodiment of a content addressable memory (CAM).

In order to test memory 24, test patterns supplied by BIST are first written into the four 4-bit segments per wordline in the illustrative 64×16 bit CAM of FIG. 5, and then the data to be compared is applied to the compare data inputs and the comparison made to see if the data originally written compares with the compare data. This comparison is done by means of four comparators 170, 172, 174, 176, the comparator 170 being configured to compare the data in the first 4-bit segment on a wordline, comparator 172 being configured to compare the data in the second 4-bit segment, comparator 174 being adapted to compare the data of the third 4-bit segment, and comparator 176 being configured to compare the four bits of data in the fourth 4-bit segment on a wordline. Each comparator block (170, 172, 174, and 178) is comprised of four 2-input XNOR gates. The output of comparator 170 provides the inputs to an AND gate 178, comparator 172 provides the inputs to AND gate 180, comparator 174 provides the input to AND gate 182, and comparator 176 provides the inputs to AND gate 184. The output of the AND gates 178, 180, 182,184 are then outputted to the DCU memory 12 and TAG memory 14.

Desired test patterns are written into memory 24 during CAM test write enable cycles and compare data is then provided during CAM test load results cycles which precipitates comparison between the said written patterns stored in the CAM's 14 segments and the compare data. The 4-bit compare data string is compared against each 4-bit pattern stored in segments 1–4 on the currently addressed wordline by segment comparator logic 170, 172, 174, and 176 feeding AND gates 178, 180, 182, and 184, respectively. If the comparison between a 4-bit segment and the compare data is true, then its respective 4-bit segment comparator logic block will output four "1"s to the AND gate it feeds, which in turn will output a "1" indicating a successful comparison between that segment and the compare data. If, however, there is a difference between one or more of the bits in the stored segment pattern and the compare data, then its respective segment comparator logic will not output all "1"s and the AND gate it feeds will output a "0" indicating a mis-compare between that segment and the compare data. For instance, if at the currently selected wordline, segment 1 contains the bit pattern 0001 while segments 2–4 contain 0010, 0100, and 1000, respectively, and the 4-bit compare data pattern presented to the CAM 24 input is 0001, then segment 1 comparator block 170 will output four "1"s, causing AND gate 178 to output a "1". Since the compare data pattern does not match the patterns stored in segments 2–4, comparator logic 172, 174 and 176 will not output all "1"s causing the AND gates they feed 180, 182, 184, respectively, to output "0"s. The output of the CAM in this example will therefore be 1000.

The output of the four AND gates 178, 180, 182 and 184 of CAM 24 is what must be verified with expect data supplied by BIST. The 4-bit expect data pattern can be any one of the four bits "on", or all four bits "on", or any one of the four bits "off", or all four bits "off" depending on the CAM test being conducted (i.e., test of the memory cells, or the XNOR gates, or the AND gates). In the example cited above, BIST should supply the expect data pattern of 1000 to match the anticipated output of a properly functioning CAM.

Data written to the CAM 24 have the same bit combinations (0001, 0010, 0100, 1000, 1111, 1110, 1101, 1011, 0111, 0000) as the expect data out. This is not to say that the data written into the memory is the same as that expected out. As previously described, before the 4-bit CAM output can be verified, four address locations of four bits each must be written into memory 24. Then, comparison data is supplied to the CAM, while the output from the CAM comparison is verified with the expect data.

The CAM mode and update control 186 (FIG. 2) functions, in addition to controlling true or complement data control and ascending or descending address control, must supply a two-bit counter (not shown) in the CAM mode and update control 186 to modify the data written into the CAM 24. The two bits are used to determine which of the four bits are to be different in the data fields of CAM 24 inputs, compare data or expect data.

Because of the different nature of the data being written to the CAM 24 and the sequence that is being written for the various CAM patterns, and particularly because of the nature of the test results, in the preferred embodiment, a separate CAM mode and update control 186, CAM data and expect data generator 188, CAM subcycle control 190, and CAM pattern control 192 are provided, as well as a CAM phase control 194 (See FIGS. 2A and 2B). However, these modules operate in a similar manner as the same type of modules for the other memories previously described and have in common address counter 34, address compare 32, clock generator 30 and central fail 46.

It should be noted that, in the case of the CAM memory 24 and DCU memory 12, during functional operation of these memories, CAM memory 24 provides a portion of the address to DCU memory 12. Therefore, while each may be tested independently, it is preferred that those two memories be tested as described in said related U.S. patent application Ser. No. 08/398,465, filed Mar. 3, 1995, entitled "Using One Memory to Supply Addresses to an Associated Memory During Testing" (Atty. Docket No. BU9-95-001), wherein the CAM memory 24 provides a portion of input to DCU memory 12 as described therein.

The state machine has been described in conjunction with the description in U.S. Pat. No. 5,173,906. This construction of the state machine with the various pattern control, address counter, data pattern generator, and mode control, subcycle control, and phase control for the global write enable and global load results works well and will provide satisfactory structure and logic using the circuit components as shown therein. However, other suitable structures for performing these various functions can also be employed. Circuit diagrams for these functions are attached hereto as Exhibit A to indicate a particular embodiment and circuit design. Based on the disclosure in U.S. Pat. No. 5,173,906, a person skilled in the art can easily substitute this particular circuit design for that disclosed in U.S. Pat. No. 5,173,906 for these various components.

Accordingly, the preferred embodiment of BIST tester for multiple memories has been described. With the foregoing description in mind, however, it is understood that this description is made only by way of example, that the invention is not limited to the particular embodiments described herein, and that various rearrangements, modifications, and substitutions may be implemented without departing from the true spirit of the invention as hereinafter claimed.

What is claimed is:

1. A single built-in self-test device for testing a plurality of memories, at least two of which have different characteristics and require different test patterns, comprising;

logic to generate test data in pre-selected test patterns specific to each type of memory and anticipated output compare data corresponding to said test data,     logic to convey said test data to at least two of said memories simultaneously,     logic to supply the address of the locations of said memory to be tested with said test data;

logic to receive output data from said memory location and compare said output data with said anticipated output compare data to provide a comparison;

control logic including;

write enable logic to selectively cause a write function of said test data on each said memory at each addressable location thereon to be tested; and logic to selectively load the results of said comparison at each addressable location thereon to be tested.

2. The invention as defined in claim 1 wherein the different characteristics of said memories include different addressable sizes, and said device includes logic to actuate the write enable selectively to each addressable location in each memory.

3. The invention as defined in claim 2 wherein said device includes logic to generate a global write enable signal and logic to generate write enable signals for each memory from said global write enable.

4. The invention as defined in claim 2 wherein said device includes logic to actuate the load results selectively from each addressable location.

5. The invention as defined in claim 4 wherein said device includes logic to generate a global load results signal and logic circuitry to generate load result signals for each of said memories from said global load result signal.

6. The invention as defined in claim 1 wherein at least one of said memories is a single-port memory and at least one of said memories is a dual-port memory, and wherein said device includes logic to generate write enable signals and load result signals for the single-port memory and for both ports of said dual-port memory.

7. The invention as defined in claim 2 wherein at least one of said memories is a content addressable memory, and at least one memory is a directly readable memory, and said device includes logic circuitry to generate compare data for each of said memories responsive to the type of said memory.

8. The invention as defined in claim 1 further characterized by a data compression system to receive and compress said output data of said memory from said test.

9. The invention as defined in claim 8 wherein said device includes a failed address register connected to said data compression system.

10. The invention as defined in claim 8 wherein said data compression system includes individual data compression connected to each of said memories.

11. A method of testing a plurality of memories at least two of which have different characteristics with at least one predetermined test pattern specific to each type of memory comprising the steps of;

generating a set of test data and anticipated output compare data for each test pattern;

conveying each set of test data and anticipated output compare data to each of said memories simultaneously;

selectively actuating a write function to locations of each memory to be tested by each test data set;

comparing the output of each memory location with the anticipated output compare data and selectively loading the results of the comparison for each address location of each memory to be tested by said test data;

whereby a plurality of memories with different characteristics are tested with a single tester.

12. The method of claim 11 wherein said different characteristics of said memories include different addressable locations, and each of said locations have write enable and load result functions selectively actuatable thereto.

13. The method of claim 12 wherein a global write enable function and a global load result function is generated, and the write function and loading result function for the addressable memory locations are generated from said global write enable and global load result functions.

14. The method as defined in claim 11 wherein single-port and multiple-port memories to be tested are provided and tested.

15. The method of claim 11 wherein the load results are used to form data compression.

16. The method of claim 15 wherein there is data compression formed for each memory.

17. The method as defined in claim 16 wherein the data compression is supplied to a failed address register.

18. The method as defined in claim 11 wherein at least one of said memories is a content addressable memory.

* * * * *